United States Patent
Ono

(10) Patent No.: US 6,720,214 B2
(45) Date of Patent: Apr. 13, 2004

(54) METHOD FOR MANUFACTURING SEMICONDUCTOR INTEGRATED CIRCUIT

(75) Inventor: Yoshiteru Ono, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/902,267

(22) Filed: Jul. 11, 2001

(65) Prior Publication Data

US 2002/0048874 A1 Apr. 25, 2002

(30) Foreign Application Priority Data

Jul. 12, 2000 (JP) ........................................ 2000-211806

(51) Int. Cl.⁷ .................... H01L 21/8238; H01L 21/336
(52) U.S. Cl. .................... 438/213; 438/14; 438/128; 438/197; 438/200; 438/213; 438/218; 438/258; 438/272
(58) Field of Search ................................ 438/197, 200, 438/218, 258, 272, 213, 14, 128

(56) References Cited

U.S. PATENT DOCUMENTS

| | | | | | |
|---|---|---|---|---|---|
| 3,968,478 | A | * | 7/1976 | Mensch, Jr. ................ | 710/305 |
| 3,987,418 | A | * | 10/1976 | Buchanan ................... | 716/19 |
| 4,144,561 | A | * | 3/1979 | Tu et al. .................... | 716/19 |
| 4,725,877 | A | * | 2/1988 | Brasen et al. .............. | 257/751 |
| 4,837,609 | A | * | 6/1989 | Gurvithc et al. ............ | 257/43 |
| 4,851,895 | A | * | 7/1989 | Green et al. ............... | 257/751 |
| 4,916,385 | A | * | 4/1990 | Tomioka et al. ........... | 324/763 |
| 5,631,484 | A | * | 5/1997 | Tsoi et al. .................. | 257/341 |
| 5,925,910 | A | * | 7/1999 | Menegoli .................... | 257/335 |
| 5,929,467 | A | * | 7/1999 | Kawai et al. ............... | 257/192 |
| 6,133,775 | A | * | 10/2000 | Schambacher et al. .... | 327/337 |
| 6,140,169 | A | * | 10/2000 | Kawai et al. ............... | 438/197 |
| 6,197,639 | B1 | * | 3/2001 | Lee et al. ................... | 438/258 |
| 2002/0004932 | A1 | * | 1/2002 | Shau .......................... | 716/19 |
| 2002/0055257 | A1 | * | 5/2002 | Gil ............................. | 438/689 |

FOREIGN PATENT DOCUMENTS

| | | |
|---|---|---|
| JP | 59-004139 | 1/1984 |
| JP | 08-051194 | 2/1996 |
| JP | 09-064187 | 3/1997 |
| JP | A-9-191095 | 7/1997 |
| JP | 11-191019 | 7/1999 |

* cited by examiner

Primary Examiner—Amir Zarabian
Assistant Examiner—Ida M. Soward
(74) Attorney, Agent, or Firm—Oliff & Berridge, PLC

(57) ABSTRACT

A semiconductor integrated circuit is provided in which the transistor size can be minimized by only changing one mask after the performance of a prototype is tested. Impurity regions are formed in predetermined regions (formed of portions surrounded by solid lines and portions surrounded by broken lines) surrounded by a field insulating film on a semiconductor substrate for prototyping, and a prototype semiconductor integrated circuit is thereby manufactured, and then testing is performed. When the prototype semiconductor integrated circuit operates in a desired manner, impurity regions are formed in predetermined regions (formed of portions surrounded by solid lines only) surrounded by a field insulating film on a semiconductor substrate for shipment, and a semiconductor integrated circuit for shipment is thereby manufactured.

8 Claims, 6 Drawing Sheets

[FIG. 1]
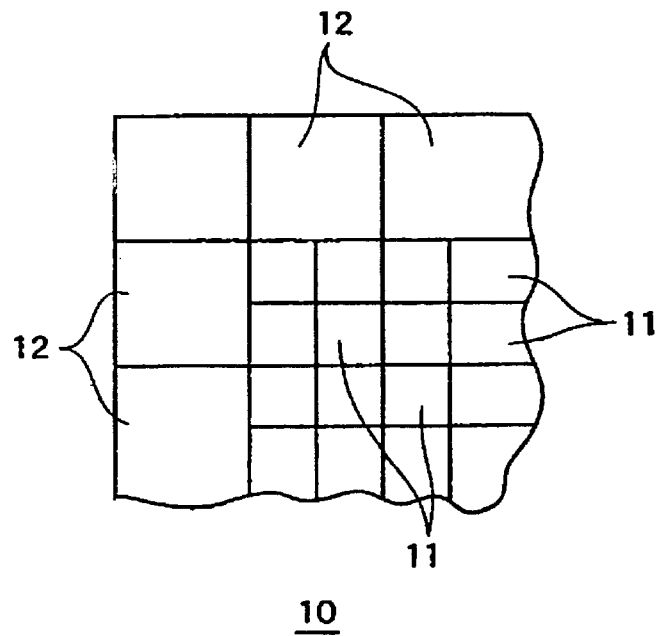
[FIG. 2]
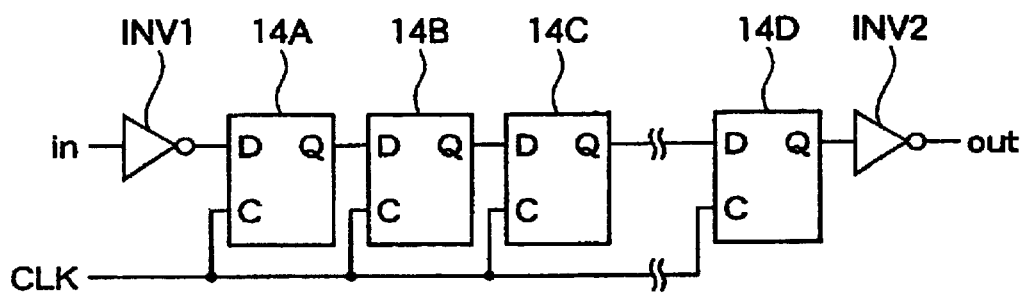

[FIG. 3]
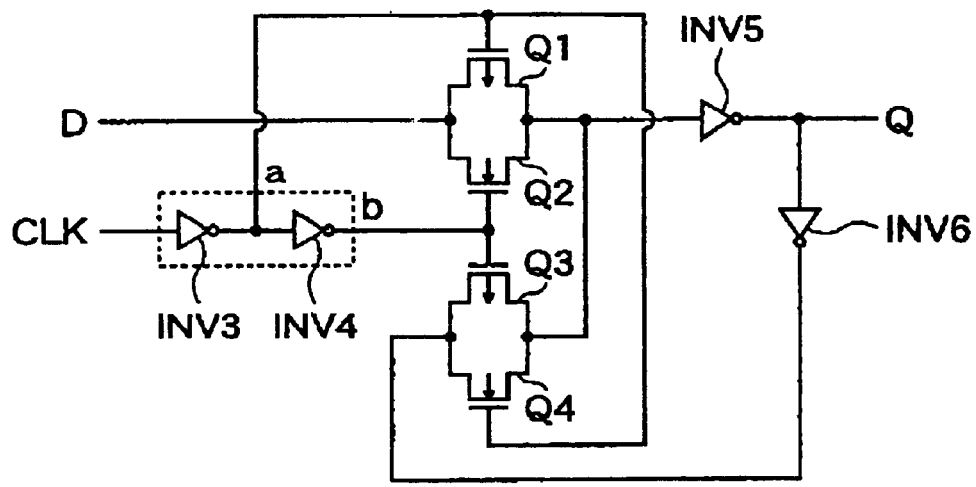
[FIG. 4]
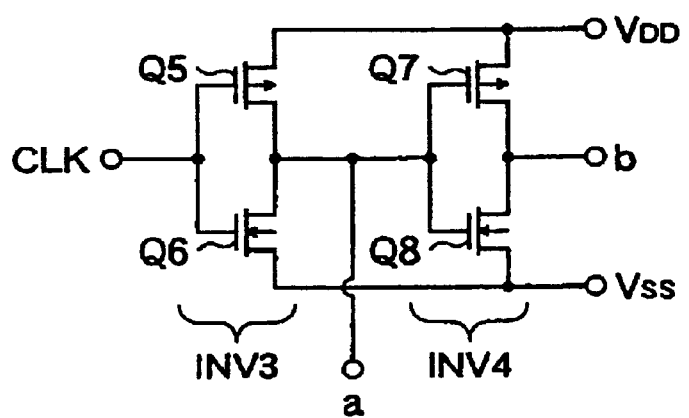

[FIG. 5]
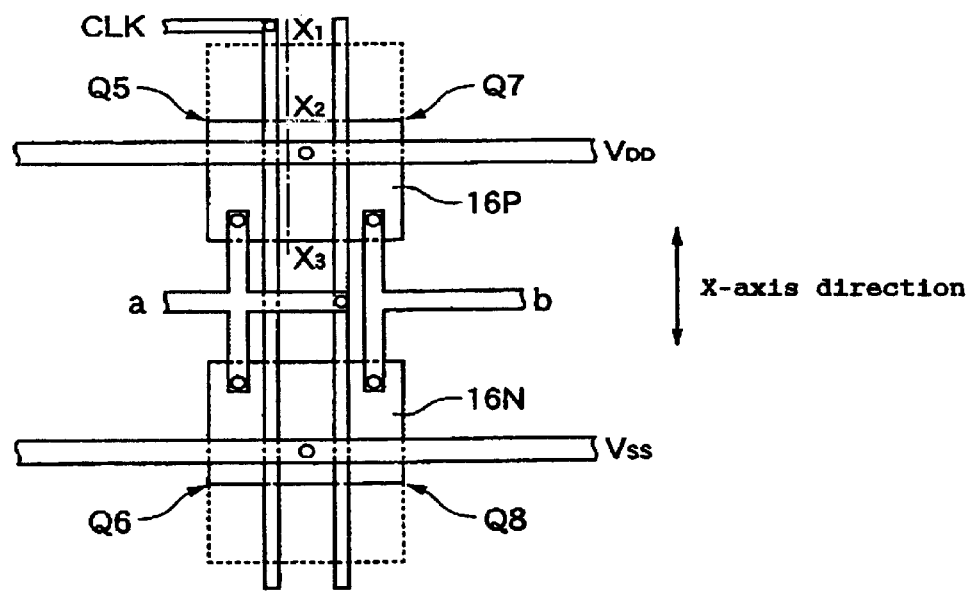

[FIG. 6]
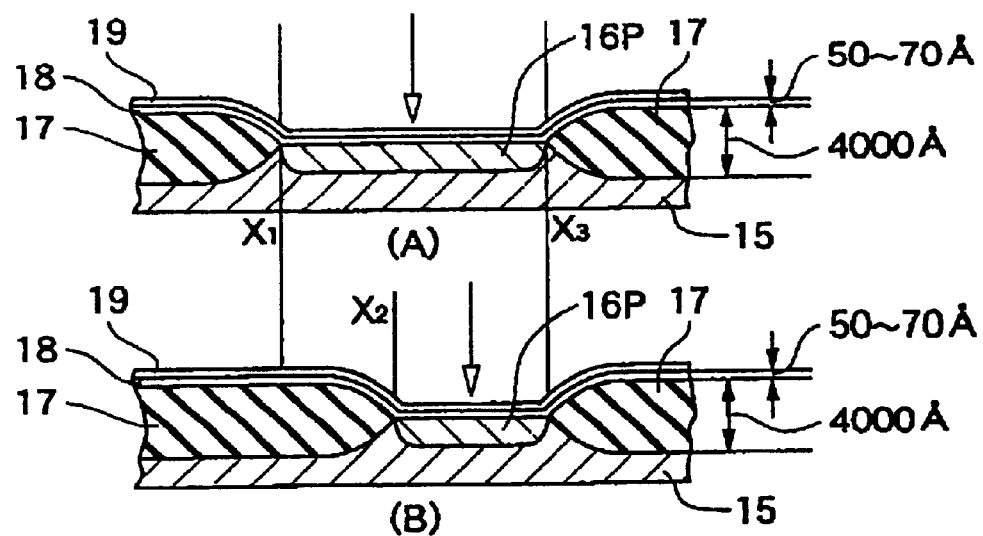

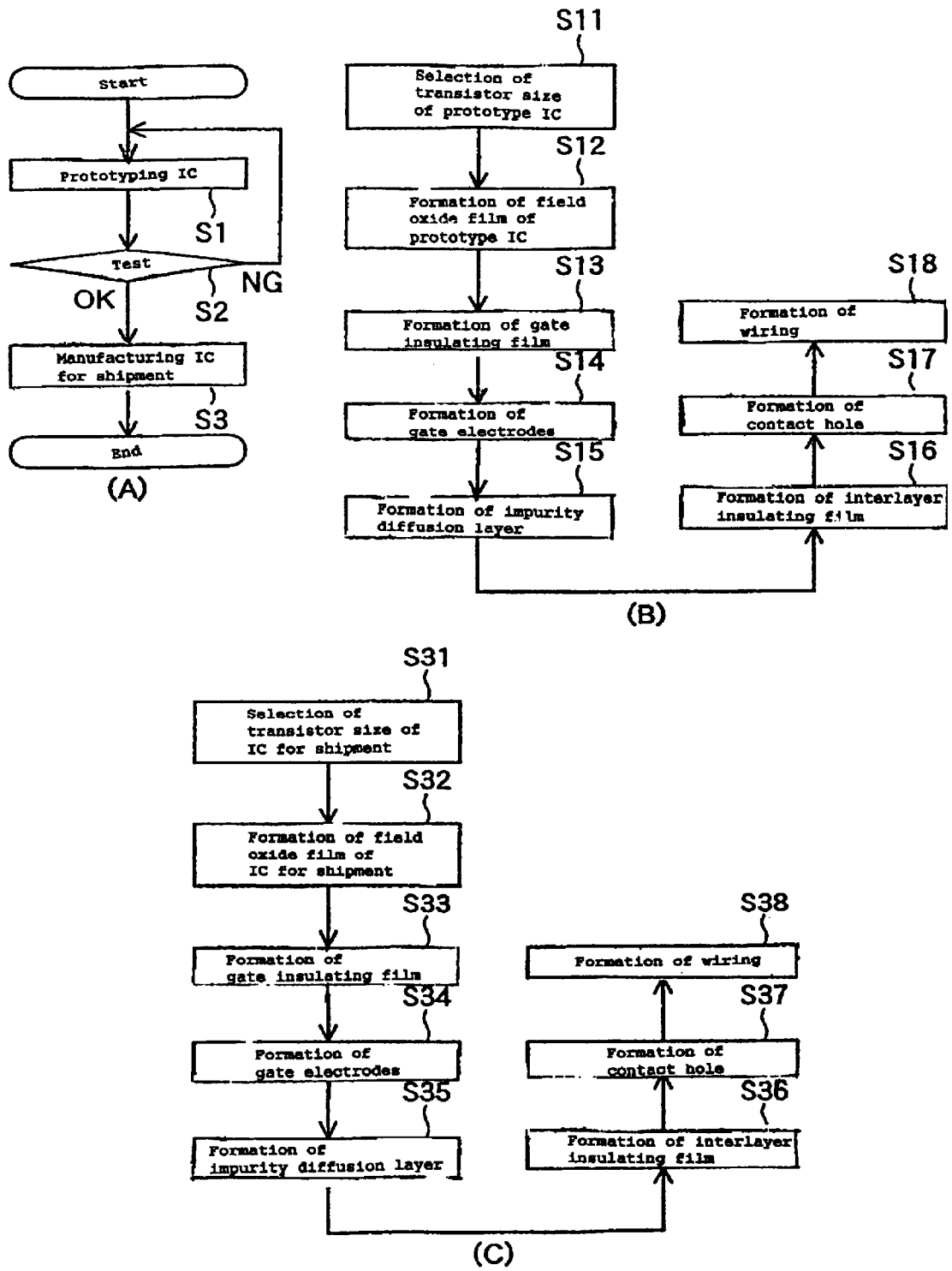
[FIG. 7]

[FIG. 8]
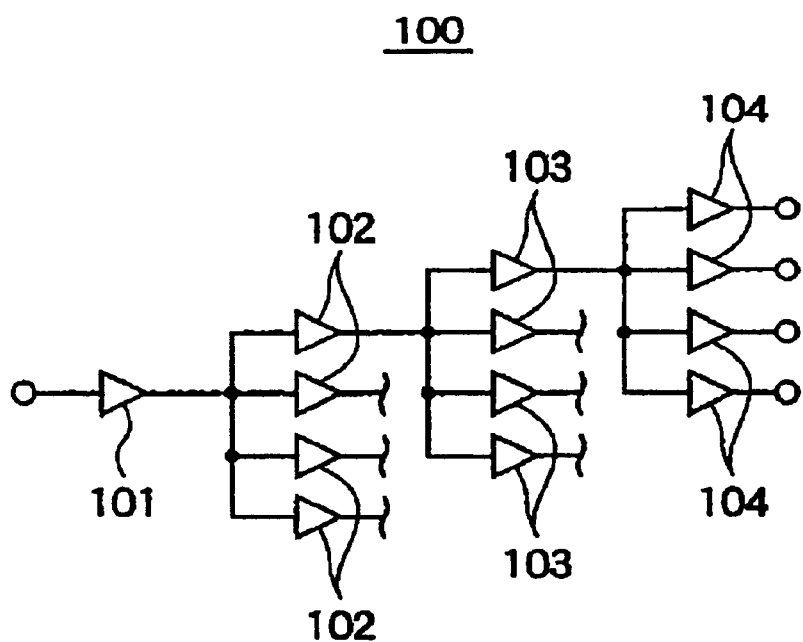

METHOD FOR MANUFACTURING SEMICONDUCTOR INTEGRATED CIRCUIT

BACKGROUND OF THE INVENTION

1. Field of Invention

The present invention relates to methods for manufacturing semiconductor integrated circuits and to semiconductor integrated circuits manufactured by these methods. More particularly, the invention relates to semiconductor integrated circuits, such as gate arrays and embedded arrays, which include logic circuits designed to meet customer specifications.

2. Description of Related Art

In order to flexibly meet customer specifications, many semiconductor integrated circuits (ICs), such as gate arrays and embedded arrays, are used. In general, a plurality of transistors included in such ICs have source/drain regions of the same shape in basic cells arrayed with a certain pitch. Consequently, many of these transistors have source/drain regions which are larger than those required for obtaining necessary driving capabilities. However, if the size of a transistor is larger, the input capacitance of the transistor is also larger. Such a large input capacitance may cause a large electric current to flow, resulting in large noise or large consumption of electric power. Therefore, in order to decrease the input capacitance and the power consumption, it is desired that the size of each transistor be minimized.

For example, a large-scale logic circuit, which operates in synchronization with input clock signals, may be included in an IC. Such a logic circuit includes, for example, a clock tree circuit, in which a plurality of buffer circuits are combined, so that an input clock signal is branched out, and a register circuit, including a plurality of flip-flop circuits, which operate in synchronization with branched out clock signals.

FIG. 8 is a circuit diagram which shows an example of a circuit configuration of such a clock tree circuit. A clock tree circuit 100 is a combinational logic circuit in which plural stages of buffer circuits (four-stage buffer circuits 101, 102, 103, and 104 in FIG. 8) are combined. The buffer circuits 101, 102, 103, and 104 are arranged and connected in a form of a tree, from a top end to a bottom end. That is, the clock tree circuit 100 branches out an input clock signal into a plurality of output clock signals (64 clock signals in FIG. 8) having the same phase.

The clock tree circuit and the register circuit, for example, include transistors to which clock signals are input. Certain amounts of parasitic capacitance (not shown as a circuit element in a circuit diagram) are present between the gate and the drain, between the gate and the source, and between the source and the drain in the transistors. Among them, the parasitic capacitance, between the gate and the drain and between the gate and the source, correspond to the input capacitance of the transistor. Therefore, a circuit in which a large number of transistors are connected in parallel has large input capacitance.

In general, transistors that have large driving power are required for a combinational logic circuit like a clock tree circuit in which many transistors and long wiring are connected to the output. On the other hand, transistors that have small driving power are sufficient for a circuit in which a small number of transistors and short wiring are connected to the output, such as a buffer circuit at the last stage of a clock tree circuit and an output circuit for outputting to a sequential logic circuit, such as a register circuit. Consequently, if a layout is designed in a way that the source/drain regions of the transistors have the same size, the input capacitance of the latter transistors may become unnecessarily large.

Therefore, Japanese Unexamined Patent Application Publication No. 9-191095 discloses a semiconductor integrated circuit in which the transistor size is minimized so that the input capacitance is reduced. In the disclosed semiconductor integrated circuit, an impurity region (area) of each transistor formed on a semiconductor substrate can be changed. That is, after an impurity region is formed in accordance with the minimum driving capability required for each transistor, an interlayer insulating film is formed, openings are formed at predetermined positions of the interlayer insulating film, and a wiring layer to electrically be connected to the gate electrode and the impurity region through the openings is formed.

However, according to the above publication, a mask for forming a field insulating film and a mask for forming an impurity region must be prepared according to the size of each transistor, and thereby a great deal of effort is required in the design. It is also troublesome to cope with changes in the design.

SUMMARY OF THE INVENTION

The present invention has been provided in view of the circumstances described above. It is an object of the present invention to provide a method for manufacturing a semiconductor integrated circuit in which the transistor size can be minimized by only changing one mask after the operation of a prototype is checked, and to provide a semiconductor integrated circuit manufactured by the manufacturing method.

According to a first aspect of the present invention, a method for manufacturing a semiconductor integrated circuit that includes a logic circuit having transistors includes the steps of:

forming a field insulating film having a first area in a predetermined region of a semiconductor substrate in order to manufacture a prototype semiconductor integrated circuit, the prototype semiconductor integrated circuit being usable to check whether a designed semiconductor integrated circuit operates accurately;

forming transistor gate insulating films and gate electrodes in predetermined regions of the semiconductor substrate for prototyping;

forming transistor impurity regions in predetermined regions surrounded by the field insulating film on the semiconductor substrate for prototyping;

forming an interlayer insulating film so as to cover at least the gate electrodes and the impurity regions;

forming openings at predetermined positions of the interlayer insulating film;

forming a wiring layer to electrically be connected to the gate electrodes and the impurity regions through the openings;

testing performance of the prototype semiconductor integrated circuit;

forming a field insulating film having a second area that is larger than the first area in a predetermined region of a new semiconductor substrate when the prototype semiconductor integrated circuit performs in a desired manner;

forming transistor gate insulating films and gate electrodes in predetermined regions of the new semiconductor substrate;

forming transistor impurity regions in predetermined regions surrounded by the field insulating film on the new semiconductor substrate;

forming an interlayer insulating film so as to cover at least the gate electrodes and the impurity regions on the new semiconductor substrate;

forming openings at predetermined positions of the interlayer insulating film on the new semiconductor substrate; and forming a wiring layer to electrically be connected to the gate electrodes and the impurity regions through the openings of the new semiconductor substrate.

According to a second aspect of the present invention, a method for manufacturing a semiconductor integrated circuit that includes a logic circuit having transistors includes the steps of:

forming a field mask (field mask for prototyping) suitable for manufacturing a prototype semiconductor integrated circuit, the prototype semiconductor integrated circuit being usable to check whether a designed semiconductor integrated circuit operates accurately;

forming a field insulating film in a predetermined region of a semiconductor substrate using the field mask for prototyping;

forming transistor gate insulating films and gate electrodes in predetermined regions of the semiconductor substrate for prototyping;

forming transistor impurity regions in predetermined regions surrounded by the field insulating film on the semiconductor substrate for prototyping;

forming an interlayer insulating film so as to cover at least the gate electrodes and the impurity regions;

forming openings at predetermined positions of the interlayer insulating film;

forming a wiring layer to electrically be connected to the gate electrodes and the impurity regions through the openings;

testing the performance of the prototype semiconductor integrated circuit;

forming a field mask (field mask for shipment) suitable for manufacturing a semiconductor integrated circuit for shipment according to the results from the testing step;

forming a field insulating film in a predetermined region of a new semiconductor substrate using the field mask for shipment;

forming transistor gate insulating films and gate electrodes in predetermined regions of the new semiconductor substrate;

forming transistor impurity regions in predetermined regions surrounded by the field insulating film on the new semiconductor substrate;

forming an interlayer insulating film so as to cover at least the gate electrodes and the impurity regions on the new semiconductor substrate;

forming openings at predetermined positions in the interlayer insulating film on the new semiconductor substrate; and forming a wiring layer to electrically be connected to the gate electrodes and the impurity regions through the openings of the new semiconductor substrate.

Herein, the logic circuit may include at least one of a combinational logic circuit, in which a plurality of buffer circuits are combined so that an input clock signal is branched out into a plurality of output clock signals, and a sequential logic circuit, in which a plurality of flip-flop circuits are combined so that input data signals are retained in synchronization with input clock signals.

Each step of forming the field insulating film, the gate insulating films, the gate electrodes, the impurity regions, the interlayer insulating film, the openings, and the wiring layer may sequentially be performed in accordance with a master slice process.

According to another aspect of the present invention, a semiconductor integrated circuit includes a plurality of basic cells arrayed with a certain pitch, the plurality of basic cells including a first group of basic cells having an active region with the a first area and a second group of basic cells having an active region with a second area smaller than the first area.

Herein, the first group of basic cells may constitute a combinational logic circuit and the second group of basic cells may constitute a sequential logic circuit.

According to the present invention, a prototype semiconductor integrated circuit is manufactured, and the circuit operation is tested. When the prototype semiconductor integrated circuit operates accurately, it is possible to minimize the transistor size by only changing the field mask. Therefore, by making a simple change, the input capacitance of the transistors can be decreased in response to the required driving capability.

BRIEF DESCRIPTION OF THE DRAWINGS

FIG. 1 is an enlarged plan view showing a part of a semiconductor integrated circuit in an embodiment of the present invention.

FIG. 2 is a circuit diagram showing a circuit configuration of a register circuit included in the semiconductor integrated circuit shown in FIG. 1.

FIG. 3 is a circuit diagram showing a circuit configuration of a D flip-flop circuit constituting the register circuit shown in FIG. 2.

FIG. 4 is a circuit diagram showing a circuit configuration of two-stage inverter circuits constituting the D-type flip-flop circuit shown in FIG. 3.

FIG. 5 is a plan view showing a layout of a semiconductor substrate provided with the two-stage inverter circuits shown in FIG. 4.

FIGS. 6(A) and 6(B) are sectional views taken along the line $X_1$–$X_2$–$X_3$ of FIG. 5; FIG. 6(A) being a sectional view of a prototype semiconductor integrated circuit to use for a performance test; and FIG. 6(B) being a sectional view of a semiconductor integrated circuit for shipment.

FIGS. 7(A)–7(C) are flowcharts illustrating a method for manufacturing a semiconductor integrated circuit in an embodiment of the present invention; FIG. 7(A) being a flowchart schematically showing a manufacturing process of the semiconductor integrated circuit; FIG. 7(B) being a flowchart which illustrates step S1 shown in FIG. 7(A) in detail; and FIG. 7(C) being a flowchart which illustrates step S3 shown in FIG. 7(A) in detail.

FIG. 8 is a circuit diagram showing a circuit configuration of a clock tree circuit.

DETAILED DESCRIPTION OF PREFERRED EMBODIMENTS

The embodiments of the present invention will be described with reference to the attached drawings.

FIG. 1 is an enlarged view showing a part of a semiconductor integrated circuit in accordance with an embodiment of the present invention. A semiconductor integrated circuit 10 includes a plurality of basic cells 11 constituting a logic circuit designed to meet customer specifications, and a plurality of buffer cells 12 constituting buffer circuits for input/output of electrical signals. The buffer cells 12 are placed on the periphery of the semiconductor integrated circuit 10 so as to surround the basic cells 11 which are arrayed in a grid shape with a certain pitch. Additionally, in FIG. 1, the basic cells 11 are shown as squares that are smaller than those of the buffer cells 12.

In a predetermined number of basic cells 11 of the semiconductor integrated circuit 10, for example, a register circuit shown in FIG. 2 is formed. The register circuit includes a plurality of D-type flip-flop circuits 14A to 14D (four of them are shown in FIG. 2) and inverter circuits INV1 and INV2 for input and output.

The D-type flip-flop circuits 14A to 14D are connected in series, and each D-type flip-flop circuit has a data input terminal D to which a data signal is input, a clock input terminal C to which a clock signal CLK is input, and a data output terminal Q from which the data signal is output. The data input terminal D of the first-stage D-type flip-flop circuit 14A is connected to an output of the inverter circuit INV1, and the data output terminal Q of the last-stage D-type flip-flop circuit 14D is connected to an input of the inverter INV2.

The register circuit inputs and outputs a data signal by a serial-in/serial-out method. That is, a data signal, which is inverted by the inverter INV1 and input to the data input terminal D of the first-stage D-type flip-flop circuit 14A, is shifted from the second-stage D-type flip-flop circuit 14B to the last-stage D-type flip-flop circuit 14D in synchronization with the timing at which a clock signal is input to the clock input terminals C of the individual-stage D-type flip-flop circuits, and the data signal is inverted by the inverter INV2 and is then output. The clock signal is supplied from one of the buffer circuits 104 in the last stage of the clock tree circuit 100 shown in FIG. 8 to the clock input terminals C of the predetermined number of D-type flip-flop circuits.

FIG. 3 is a circuit diagram showing an example of a circuit configuration of such a D-type flip-flop circuit. The D-type flip-flop circuit includes transistors Q1 to Q4 constituting a switching circuit and inverter circuits INV3 to INV6. The transistors Q1 and Q3 are p-channel MOS transistors, and transistors Q2 and Q4 are n-channel MOS transistors.

The sources or drains of the transistor Q1 and the transistor Q2 are connected to each other. Similarly, the sources or drains of the transistor Q3 and the transistor Q4 are connected to each other. The inverter circuit INV3 supplies an inverted clock signal to the gate of the transistor Q1 and the gate of the transistor Q4, while the inverter circuit INV4 supplies a clock signal to the gate of the transistor Q2 and the gate of the transistor Q3. The output of the inverter circuit INV5 is connected to the data output terminal Q and to the input of the inverter circuit INV6.

The sources and drains of the transistor Q1 and the transistor Q2 are connected between the data input terminal D and the input of the inverter circuit INV5, while the sources and drains of the transistor Q3 and the transistor Q4 are connected between the output of the inverter circuit INV6 and the input of the inverter circuit INV5.

FIG. 4 is a circuit diagram showing an example of a circuit configuration of two-stage inverter circuits INV3 and INV4 included in a D-type flip-flop circuit. In the inverter circuit INV3, a p-channel MOS-type transistor Q5 and an n-channel MOS-type transistor Q6 are complementarily connected to each other, and similarly, in the inverter circuit INV4, a p-channel MOS-type transistor Q7 and an n-channel MOS-type transistor Q8 are complementarily connected to each other. The sources of the transistor Q5 and the transistor Q7 are connected to a line extending to a high-potential-side power supply voltage $V_{DD}$, and the sources of the transistor Q6 and the transistor Q8 are connected to a line extending to a low-potential-side power supply voltage $V_{SS}$. That is, the inverter circuits INV3 and INV4 are CMOS-type circuits. Additionally, either the power supply voltage $V_{DD}$ or the power supply voltage $V_{SS}$ can be set as a ground potential.

The gates of the transistor Q5 and the transistor Q6 constitute an input terminal, and the drains of the transistor Q5 and the transistor Q6 are connected to the gates of the transistor Q7 and the transistor Q8. An output terminal "a" is branched out from the drains of the transistor Q5 and the transistor Q6. The drains of the transistor Q7 and the transistor Q8 constitute an output terminal "b".

Next, a method for manufacturing a semiconductor integrated circuit in accordance with an embodiment of the present invention will be described with reference to FIGS. 5 to 7.

As shown in FIG. 7(A), the manufacturing process of the semiconductor integrated circuit in this embodiment is roughly divided into step S1, in which a prototype semiconductor integrated circuit is manufactured, step S2, in which the operation of the prototype semiconductor integrated circuit is tested, and step S3, in which a semiconductor integrated circuit for shipment is manufactured.

In step S1 (prototype), since the size of the transistors is set to be uniform, designing the layout is greatly facilitated. Step S1 (prototype) includes steps S11 to S18 shown in FIG. 7(B).

First, in step S1, one transistor size is selected from a plurality of transistor sizes so that predetermined sizes of a p-type impurity region 16P and an n-type impurity region 16N, as shown in FIG. 5, for example, are formed in a semiconductor substrate 15. The impurity regions of the transistors are formed of portions, marked in full line and portions marked in broken line in FIG. 5, so as to meet the sizes of the transistors in a combinational logic circuit which requires a large driving capability. For that purpose, a field mask suitable for forming the impurity regions with such sizes is prepared.

Next, in step S12, using the field mask prepared in step 11, the peripheries of the regions in which the impurity regions 16P and 16N, for example, are formed are oxidized. By step S12, as shown in FIG. 6(A), a thick field insulating film, that is oxide film 17, is formed on the semiconductor substrate 15.

Furthermore, in step S13, an insulating film is formed so as to cover the region surrounded by the field insulating film 17 on the semiconductor substrate 15. Then, in step S14, a conductive film is formed, and etching is performed using a mask for forming gate electrodes (gate mask) so that, as shown in FIG. 5 or FIG. 6(A), gate electrodes 19 and gate insulating films 18, that are parallel to each other in the X-axis direction, are formed by patterning.

Next, in step S15, using a mask for forming impurity regions (impurity diffusion mask), as shown in FIG. 6(A), the impurity regions 16P and 16N are formed in the regions surrounded by the field insulating film 17 on the semiconductor substrate 15. That is, a p-type impurity is implanted in the region represented by reference numeral 16P (in the direction indicated by a white arrow), and the impurity region 16P is thereby formed. An n-type impurity is implanted in the region represented by reference numeral 16N, and the impurity region 16N is thereby formed.

In step S16, an interlayer insulating film is formed, and in step S17, using a mask for forming contact holes (contact mask), as shown in FIG. 5, contact holes (indicated by while circles in FIG. 5) are formed at predetermined positions of the interlayer insulating film. Then, in step S18, using a mask for forming wiring to electrically be connected to the impurity regions 16P and 16N and the gate electrodes 19 through the contact holes (wiring mask), wiring is formed, and the prototype semiconductor integrated circuit is thereby obtained. Additionally, in FIG. 6(A), the interlayer insulating film and the wiring are omitted.

Herein, steps S12 to S18 may sequentially be performed in accordance with a master slice process (namely, when an integrated circuit is designed, a master pattern in which elements, such as transistors, are appropriately placed is formed, and groups of integrated circuits having various functions are formed by changing evaporated aluminum masks for interconnecting the elements as necessary).

Next, in step S2, the performance of the prototype semiconductor integrated circuit obtained in step S1 is tested, and it is checked to determine whether the semiconductor integrated circuit designed to meet customer specifications operates according to the specifications. When the prototype semiconductor integrated circuit does not operate according to the specifications, although a change in design and another prototyping must be performed, since the size of the transistors is set uniformly, the layout can be changed very easily. When the prototype semiconductor integrated circuit operates according to the specifications, step S3 is performed. Step S3 includes steps S31 to S38 shown in FIG. 7(C).

First, in step S31, in order to reduce the sizes of the transistors Q5 to Q8, a field mask in which the region of the field insulating film is enlarged is formed. The impurity regions of the transistors are only formed of the portions marked in full line in FIG. 5 so as to meet the size of transistors in the sequential logic circuit for which a small driving capability is sufficient. The input capacitance of the transistors Q5 to Q8 can be thereby decreased.

Next, in step S32, using the field mask formed in step S31, the peripheries of the regions, in which the impurity regions 16P and 16N, for example, are formed, are oxidized. By step S32, as shown in FIG. 6(B), a thick field insulating film 17 is formed on a semiconductor substrate 15. Then, steps S33 to S38 are performed in a manner similar to that of steps S13 to S18, and the semiconductor integrated circuit for shipment is thereby obtained. Additionally, in FIG. 6(B), the interlayer insulating film and the wiring are omitted.

In step S35, since the impurity diffusion mask used for manufacturing the prototype semiconductor integrated circuit is used again, as shown in FIG. 6(B), an impurity is implanted in the field insulating film 17 and in the region surrounded by the field insulating film 17 on the semiconductor substrate 15. However, the field insulating film 17 has a thickness of, for example, 4,000 Å (40 nm), in contrast to the conventional oxide film with a thickness of, for example, 50 to 70 Å (0.5 to 0.7 nm), and the impurity is not practically implanted in the semiconductor substrate under the field insulating film 17. Therefore, it is not necessary to use different impurity diffusion masks for prototyping and for shipment, and the sizes of the impurity regions 16P and 16N are optimized by only changing the field mask. That is, after testing is performed in step S2, the size of the transistors can be minimized by making a slight change in the manufacturing process.

As described above, according to the present invention, by only changing one mask after the performance of the prototype is tested, the size of the transistors can be minimized. Therefore, it is possible to decrease the input capacitance of the transistors so as to meet the required driving capacity, and a long-time delay, the occurrence of noise due to a large input capacitance and large consumption of electric power can be avoided.

What is claimed is:

1. A method for manufacturing a semiconductor integrated circuit that includes a logic circuit having transistors, the method comprising the steps of:

forming a field insulating film having a first area in a predetermined region of a semiconductor substrate in order to manufacture a prototype semiconductor integrated circuit, the prototype semiconductor integrated circuit being usable to check whether the designed semiconductor integrated circuit operates accurately;

forming transistor gate insulating films and gate electrodes in predetermined regions of the semiconductor substrate for prototyping;

forming transistor impurity regions in predetermined regions surrounded by the field insulating film on the semiconductor substrate for prototyping using an impurity diffusion mask;

forming an interlayer insulating film so as to cover at least the gate electrodes and the impurity regions;

forming openings at predetermined positions of the interlayer insulating film;

forming a wiring layer to electrically be connected to the gate electrodes and the impurity regions through the openings;

testing the performance of the prototype semiconductor integrated circuit;

forming a field insulating film having a second area that is larger than the first area in a predetermined region of a new semiconductor substrate when the prototype semiconductor integrated circuit performs in a desired manner;

forming transistor gate insulating films and gate electrodes in predetermined regions of the new semiconductor substrate;

forming transistor impurity regions in predetermined regions surrounded by the field insulating film on the new semiconductor substrate using the impurity diffusion mask;

forming an interlayer insulating film so as to cover at least the gate electrodes and the impurity regions on the new semiconductor substrate;

forming openings at predetermined positions of the interlayer insulating film on the new semiconductor substrate; and forming a wiring layer to electrically be connected to the gate electrodes and the impurity regions through the openings of the new semiconductor substrate.

2. A method for manufacturing a semiconductor integrated circuit that includes a logic circuit having transistors, the method comprising the steps of:

forming a field mask (field mask for prototyping) suitable for manufacturing a prototype semiconductor integrated circuit, the prototype semiconductor integrated circuit being usable to check whether the designed semiconductor integrated circuit operates accurately;

forming a field insulating film in a predetermined region of a semiconductor substrate using the field mask for prototyping;

forming transistor ate insulating films and gate electrodes in predetermined regions of the semiconductor substrate for prototyping;

forming transistor impurity regions in predetermined regions surrounded by the field insulating film on the semiconductor substrate for prototyping using an impurity diffusion mask;

forming an interlayer insulating film so as to cover at least the gate electrodes and the impurity regions;

forming opening at predetermined positions of the interlayer insulating film;

forming a wiring layer to electrically be connected to the gate electrodes and the impurity regions through the openings;

testing the performance of the prototype semiconductor integrated circuit;

forming a field mask (field mask for shipment) suitable for manufacturing a semiconductor integrated circuit for shipment according to the results in the testing step;

forming a field insulating film in a predetermined region of a new semiconductor substrate using the field mask for shipment;

forming transistor gate insulating films and gate electrodes in predetermined regions of the new semiconductor substrate;

forming transistor impurity regions in predetermined regions surrounded by the field insulating film on the new semiconductor substrate using the impurity diffusion mask;

forming an interlayer insulating film so as to cover at least the gate electrodes and the impurity regions on the new semiconductor substrate;

forming openings at predetermined positions in the interlayer insulating film on the new semiconductor subs ate; and forming a wiring layer to electrically be connected to the gate electrodes and the impurity regions through the openings of the new semiconductor substrate.

3. The method for manufacturing a semiconductor integrated circuit according to claim 1, the logic circuit including at least one of a combinational logic circuit, in which a plurality of buffer circuits are combined so that an input clock signal is branched out into a plurality of output clock signals, and a sequential logic circuit, in which a plurality of flip-flop circuits are combined so that input data signals are retained in synchronization with input clock signals.

4. The method for manufacturing a semiconductor integrated circuit according to claim 1, each step of forming the field insulating film, the gate insulating films, the gate electrodes, the impurity regions, the interlayer insulating film, the openings, and the wiring layer being sequentially performed in accordance with a master slice process.

5. A semiconductor integrated circuit manufactured by the method for manufacturing a semiconductor integrated circuit according to claim 1, the logic circuit including at least one of a combinational logic circuit, in which a plurality of buffer circuits are combined so that an input clock signal is branched out into a plurality of output clock signals, and a sequential logic circuit, in which a plurality of flip-flop circuits are combined so that input data signals are in synchronization with input clock signals.

6. The method for manufacturing a semiconductor integrated circuit according to claim 2, the logic circuit including at least one of a combinational logic circuit, in which a plurality of buffer circuits are combined so that an input clock signal is branched out into a plurality of output clock signals, and a sequential logic circuit, in which a plurality of flip-flop circuits are combine so that input data signals are retained in synchronization with input clock signals.

7. The method for manufacturing a semiconductor integrated circuit according to claim 2, each step f forming the field insulating film, the gate insulating films, the gate electrodes, the impurity regions, the interlayer insulating film, the openings, and the wiring layer being sequentially performed in accordance with a master slice process.

8. A semiconductor integrated circuit manufactured by the method for manufacturing a semiconductor integrated circuit according to claim 2, the logic circuit including at least one of a combinational logic circuit, in which a plurality of buffer circuits are combined so that an input clock signal is branched out into a plurality of output lock signals, and a sequential logic circuit, in which a plurality of flip-flop circuits are combined so that input data signals are retained in synchronization with input clock signals.

* * * * *